United States Patent
Hong et al.

(10) Patent No.: US 8,400,194 B2
(45) Date of Patent: Mar. 19, 2013

(54) INTERFACE SYSTEM FOR A COG APPLICATION

(75) Inventors: Ju-Pyo Hong, Daejeon-si (KR); Jung-Hwan Choi, Daejeon-si (KR); Jun-Ho Kim, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 92 days.

(21) Appl. No.: 13/142,413

(22) PCT Filed: Dec. 28, 2009

(86) PCT No.: PCT/KR2009/007828
§ 371 (c)(1), (2), (4) Date: Jun. 27, 2011

(87) PCT Pub. No.: WO2010/077037
PCT Pub. Date: Jul. 8, 2010

(65) Prior Publication Data
US 2011/0267022 A1    Nov. 3, 2011

(30) Foreign Application Priority Data
Dec. 29, 2008 (KR) .......... 10-2008-0135783

(51) Int. Cl.
*H03B 1/00* (2006.01)
*H03K 3/00* (2006.01)

(52) U.S. Cl. .......... 327/108; 327/109; 327/117; 326/82; 326/83; 326/86; 326/87; 455/73; 455/78; 455/84; 455/88

(58) Field of Classification Search .......... 327/108, 327/109, 117; 326/82–83, 86–87; 455/73, 455/78, 84, 88
See application file for complete search history.

(56) References Cited

U.S. PATENT DOCUMENTS

| | | |
|---|---|---|
| 5,977,796 A | 11/1999 | Gabara |
| 6,593,801 B1 | 7/2003 | Hattori |
| 2006/0238037 A1* | 10/2006 | Oh et al. .......... 307/409 |

FOREIGN PATENT DOCUMENTS

| | | |
|---|---|---|
| KR | 1020010062003 A | 7/2001 |
| KR | 100588752 B1 | 6/2006 |

OTHER PUBLICATIONS

International Search Report of International application No. PCT/KR2009/007828 filed Dec. 28, 2009.
Written Opinion of the International Searching Authority of International application No. PCT/KR2009/007828 filed Dec. 28, 2009.

* cited by examiner

*Primary Examiner* — John Poos
(74) *Attorney, Agent, or Firm* — Kile Park Goekjian Reed & McManus PLLC

(57) ABSTRACT

A current driving type transmitter using independent current signals, which can independently generate and transmit differential current indicating a logic state of data to be transmitted, using a difference between positive data current and negative data current without using external current, so that magnitudes of current applied to a pair of transmission lines can be kept constant without being influenced by the design of current sources and processing factors, a current driving type receiver using independent current signals, which can simultaneously convert a difference in levels of current, received through the transmission lines, into a voltage level by a single I-V converter, so that errors of a true line and a bar line can be lessened, and an interface system for COG application, which adopts the transmitter and receiver, so that distortion of transmitted signals can be reduced.

14 Claims, 4 Drawing Sheets

INTERFACE SYSTEM FOR A COG APPLICATION

BACKGROUND OF THE INVENTION

1. Field of the Invention

The present invention relates to a current driving type transmitter and receiver which can transmit data in the form of differential current through a pair of transmission lines between semiconductor chips in a COG (chip-on-glass) type image display device, and an interface system for COG application which adopts the current driving type transmitter and receiver. More particularly, the present invention relates to a current driving type transmitter and receiver using independent current signals, which can independently generate and transmit positive data current and negative data current for generating differential current indicating data to be transmitted, and an interface system for COG application which adopts the current driving type transmitter and receiver to reduce distortion of transmitted signals.

2. Description of the Related Art

In the conventional art, data transmission between semiconductor chips through transmission lines is implemented in a manner such that a transmitter transmits data in the form of a differential voltage through a pair of differential transmission lines, and a receiver receives data in the form of a voltage, converts the voltage into data to be displayed and utilizes the converted data.

However, such a data transmission method using a voltage difference is likely to be influenced by the length of transmission lines between semiconductor chips. In particular, considering a recent technology trend in which the distance between semiconductor chips is gradually lengthened, the transmission lines have large impedance. Therefore, since the data transmission method using a voltage difference is not appropriate, a data transmission method using current has been proposed in the art.

Concretely speaking, in a conventional mLVDS (mini low voltage differential signaling) scheme using a differential voltage, data and a clock signal are transmitted to a driver IC through a printed circuit board in a multi-drop type. In this case, far end resistors, which are installed at the far end of the printed circuit board, receive the data and the clock signal in the form of voltages. However, in the case of a COG application due to recent trend toward a slim appearance, a timing controller and a driver IC are configured to have a point-to-point drop type, and transmission lines are directly realized on the glass of a panel. Therefore, since a large impedance component exists between the timing controller and the driver IC, distortion of waveforms is likely to seriously occur. In these situations, an LCDS (low current differential signaling) scheme as a data transmission method using current has recently been proposed.

In the current driving scheme as data transmission by current, data is transmitted in the type of current through transmission lines from a transmitter, and a receiver restores the data from the current and utilizes the restored data. The current driving scheme is divided into a single current driving scheme in which one data bit is transmitted through one transmission line, and a differential current driving scheme in which current having different magnitudes is transmitted through two transmission lines and data is restored using a difference in magnitudes of current between the two transmission lines.

In the differential current driving scheme, a transmitter generates bit data using current of different magnitudes and transmits generated bit data through two transmission lines, and a receiver restores the data using a difference in the magnitudes of current between the two transmission lines. In the differential current driving scheme, when compared to the single current driving scheme, while distortion of transmitted signals by noise is not substantial, interference occurs between the transmission lines due to physical positions of the two transmission lines and the parasitic resistance, parasitic inductance and parasitic capacitance of the two transmission lines. As a consequence, the transmitted signals are likely to be distorted, and the time constants of the transmission lines increase, thereby lengthening the transition times of the signals, whereby the transmission speeds of the signals cannot but decrease.

In order to cope with these problems, a differential current driving type transmitter has been disclosed in Korean Patent No. 10-0588752. The differential current driving type transmitter includes a first base current source for supplying first base current Icc1 indicating a base logic state to a true line TX+ of a pair of transmission lines; a second base current source for supplying second base current Icc2 indicating a base logic state to a bar line TX− of the pair of transmission lines; a transition current source for generating transition current Idc indicating a transition logic state as to one of the pair of transmission lines; an equalizing switch for equalizing potentials of the pair of transmission lines; a transition switch for supplying the transition current to the true line or the bar line depending upon a logic value of data to be transmitted; and a transmission controller for controlling switching of the equalizing switch and the transition switch in correspondence to the data to be transmitted.

In the transmitter, one transition current source is connected to one of two base current sources composed of the first base current source and the second base current source depending upon a data signal, and produces a difference in current level between the two transmission lines. Nevertheless, in this case, the first and second base current sources are likely to produce different current values due to deviations in terms of design, process, test condition, etc. As a consequence, the magnitudes of the current applied to the pair of transmission lines by the data signal may vary.

In this regard, referring to FIG. 1, when assuming that the first base current Icc1 supplied by the first base current source is Iref+α, the second base current Icc2 supplied by the second base current source is Iref−α and the transition current Idc supplied by the transition current source is I, current flowing to the true line TX+ of the pair of transmission lines becomes I+Iref+α as the sum of the transition current I and the first base current Iref+α, and current flowing to the bar line TX− is Iref−α. If data transits, current flowing to the true line TX+ of the pair of transmission lines is Iref+α, and current flowing to the bar line TX− becomes I+Iref−α as the sum of the transition current I and the second base current Iref−α. Therefore, every time when transition occurs according to a data value, a problem is caused in that a current value is made unstable.

In the meanwhile, a receiver, including a true line current mirror which is configured to mirror data signal current Irx+ flowing through a true line TX+ of a pair of transmission lines and generate true line mirroring current Irx+, a bar line current mirror which is configured to mirror data signal current Irx− flowing through a bar line TX− of the pair of transmission lines and generate bar line mirroring current Irx−, a true line I-V converter which is configured to generate a true line reception voltage having a level corresponding to the true line mirroring current Irx+, a bar line I-V converter which is configured to generate a bar line reception voltage having a level corresponding to the bar line mirroring current Irx−, and a differential amplifier which is configured to amplify a difference in level between the true line reception voltage and the bar line reception voltage, has been proposed.

Nonetheless, in the receiver, since the I-V converters are respectively provided for the true line and the bar line, errors of the true line and the bar line are respectively converted into voltages and are inputted to the differential amplifier. Due to this fact, a problem is caused in that distortion of the transmitted signals increases. Also, the two converters needed in the receiver increase the size of the receiver, whereby a layout area cannot but be enlarged.

SUMMARY OF THE INVENTION

Accordingly, the present invention has been made in an effort to solve the problems occurring in the related art, and an object of the present invention is to provide a current driving type transmitter using independent current signals, which can independently generate and transmit differential current indicating a logic state of data to be transmitted, using a difference between positive data current and negative data current without using external current, so that magnitudes of current applied to a pair of transmission lines can be kept constant without being influenced by the design of current sources and processing factors, a current driving type receiver using independent current signals, which can simultaneously convert a difference in levels of current, received through the transmission lines, into a voltage level by a single I-V converter, so that errors of a true line and a bar line can be lessened, and an interface system for COG application, which adopts the transmitter and receiver, so that distortion of transmitted signals can be reduced.

In order to achieve the above object, according to one aspect of the present invention, there is provided an interface system for COG application, adapted for transmitting a logic state of data using different current, receiving the differential current, and restoring the logic state of the data, comprising a transmitter including a first data current source configured to independently generate and supply positive data current that constitutes the differential current, a second data current source configured to independently generate and supply negative data current, a first selection switch configured to supply the positive data current to a true line or a bar line through a switching operation depending upon a logic state of data to be transmitted, a second selection switch configured to supply the negative data current to the bar line or the true line through a switching operation, an equalizing switch connected between the true line and the bar line and configured to equalize potentials of transmission lines, and a switching controller configured to control the switching operations; the transmission lines composed of the true line and the bar line which are supplied with the positive data current and the negative data current through the switching operations of the first and second selection switches; and a receiver configured to instantaneously convert a difference in levels of true line reception current received from the true line and bar line reception current received from the bar line into a voltage level, and restore data.

According to another aspect of the present invention, the receiver comprises a true line current mirror configured to receive current flowing through the true line and generate the true line reception current; a bar line current mirror configured to receive current flowing through the bar line and generate the bar line reception current; a single I-V converter including a first resistor which is connected at one end thereof to a node to which the true line reception current is supplied, a second resistor which is connected at one end thereof to a node to which the bar line reception current is supplied, a current source which is commonly connected to the other ends of the first resistor and the second resistor, and a terminal of a power supply voltage into and from which the true line reception current and the bar line reception current flow by the current source and which determines levels of reception voltages; and a differential amplifier configured to receive and amplify a difference in the levels of the reception voltages.

According to still another aspect of the present invention, the receiver comprises a single I-V converter including a first resistor which is connected at one end thereof to the true line and receives true line reception current, a second resistor which is connected at one end thereof to the bar line and receives bar line reception current, and a current source which has one end commonly connected to the other ends of the first resistor and the second resistor and the other end connected to a ground terminal; a common voltage generator which is configured such that a first terminal is connected to the current source, a second terminal forms a common node together with one end of the first resistor and is connected to the non-inverting terminal of the differential amplifier, and a third terminal forms a common node together with one terminal of the second resistor and is connected to the inverting terminal of the differential amplifier; and a differential amplifier configured to receive through a non-inverting terminal and an inverting terminal thereof a difference in voltage levels converted in the single I-V converter and amplify the difference.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
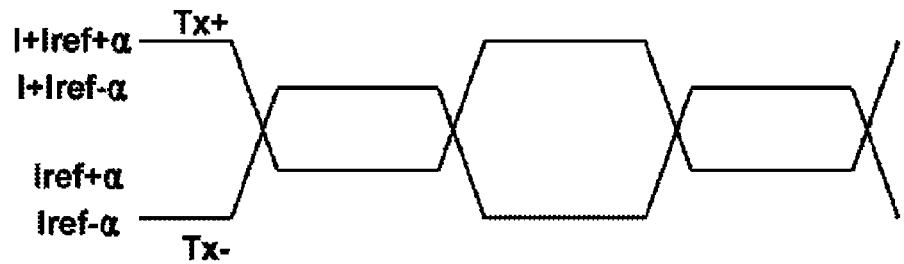
FIG. 1 is a view illustrating levels of differential current applied to a pair of transmission lines in a conventional differential current driving scheme.

Reference will now be made in greater detail to preferred embodiments of the invention, examples of which are illustrated in the accompanying drawings. Wherever possible, the same reference numerals will be used throughout the drawings and the description to refer to the same or like parts.

Figure 2:
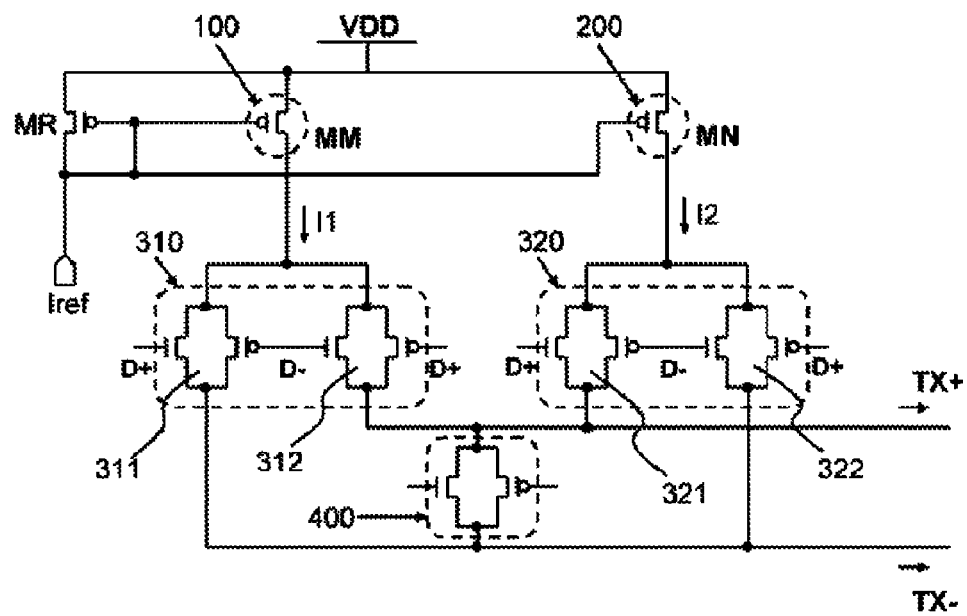
FIG. 2 is a circuit diagram of a current driving type transmitter using independent current signals in accordance with an embodiment of the present invention.

Referring to FIG. 2, a current driving type transmitter using independent current signals in accordance with an embodiment of the present invention includes a first data current source 100 configured to generate positive data current, a second data current source 200 configured to generate negative data current, a selection switch configured to select a transmission line to be supplied with the positive data current and negative data current depending upon whether data to be transmitted transits or not, an equalizing switch 400 configured to equalize potentials of a pair of transmission lines after transmitting data and before newly transmitting data, and a switching controller configured to control switching operations of the selection switch and the equalizing switch by data to be transmitted.

The first data current source 100 and the second data current source 200 include current mirrors which independently generate differential current to be transmitted to a receiver through the pair of transmission lines composed of a true line TX+ and a bar line TX−. In order to independently generate a logic state depending upon a change in data to be transmitted, the first data current source 100 is configured to generate positive data current indicating one logic state, and the second data current source 200 is configured to generate negative data current indicating the other logic state.

The first data current source 100 includes a second MOS transistor MM which is connected to a first MOS transistor MR for supplying reference current Iref and constitutes a current mirror. The second MOS transistor MM is configured such that one terminal is connected to a power supply voltage VDD, the other terminal is connected to a first selection switch 310, and the gate is connected to the gate of the first MOS transistor MR.

The first data current source 100 configured in this way supplies positive data current I1 mirrored through the first MOS transistor MR selectively to the true line TX+ or the bar line TX− by the switching operation of the first selection switch 310.

The second data current source 200 includes a third MOS transistor MN which is connected to the first MOS transistor MR for supplying the reference current Iref and constitutes a current mirror. The third MOS transistor MN is configured such that one terminal is connected to the power supply voltage VDD, the other terminal is connected to a second selection switch 320, and the gate is connected to the gate of the first MOS transistor MR.

The second data current source 200 configured in this way supplies negative data current I2 mirrored through the first MOS transistor MR selectively to the bar line TX− or the true line TX+ by the switching operation of the second selection switch 320.

Since the first data current source 100 and the second data current source 200 receive the same reference current Iref from the first MOS transistor MR, the positive data current I1 supplied from the first data current source 100 and the negative data current I2 supplied from the second data current source 200 are generated to have magnitudes that are proportional to the reference current Iref, and are then respectively supplied to the first selection switch 310 and the second selection switch 320. It is preferred that the first data current source 100 and the second data current source 200 be configured to generate current at a preset ratio, for example, 1:a or 1:b where a and b are natural numbers, so that differential current can be supplied to transmit a logic state of data.

The selection switch includes the first selection switch 310 which is configured to supply the current supplied from the first data current source 100 to the true line TX+ or the bar line TX− through a switching operation, and the second selection switch 320 which is configured to supply the current supplied from the second data current source 200 to the bar line TX− or the true line TX+ through a switching operation.

It is preferred that the first selection switch 310 include first and second transmission gates 311 and 312 which are configured such that one terminals are commonly connected to the first data current source 100, gates are applied with a positive data signal D+ and a negative data signal D− and the other terminals are respectively connected to the bar line TX− and the true line TX+, are switched by the positive data signal D+ and the negative data signal D−, and select a transmission line to be supplied with the positive data current I1.

The first transmission gate 311 is configured such that one terminal is connected to the other terminal of the first data current source 100, the other terminal is connected to the bar line TX−, the gate of an NMOS transistor is applied with the positive data signal D+, and the gate of a PMOS transistor is applied with the negative data signal D−.

The second transmission gate 312 is configured such that one terminal is connected to the other terminal of the first data current source 100, the other terminal is connected to the true line TX+, the gate of a PMOS transistor is applied with the positive data signal D+, and the gate of an NMOS transistor is applied with the negative data signal D−.

Accordingly, if data to be transmitted transits and the positive data signal D+ is in a logic high state, the first transmission gate 311 is turned on and the second transmission gate 312 is turned off, and the positive data current I1 supplied from the first data current source 100 is supplied to the bar line TX−. If the positive data signal D+ is in a logic low state, the first transmission gate 311 is turned off and the second transmission gate 312 is turned on, and the positive data current I1 supplied from the first data current source 100 is supplied to the true line TX+.

It is preferred that the second selection switch 320 include third and fourth transmission gates 321 and 322 which are configured such that one terminals are commonly connected to the second data current source 200, gates are applied with the positive data signal D+ and the negative data signal D− and the other terminals are respectively connected to the true line TX+ and the bar line TX−, are switched by the positive data signal D+ and the negative data signal D−, and select a transmission line to be supplied with the negative data current I2.

The third transmission gate 321 is configured such that one terminal is connected to the other terminal of the second data current source 200, the other terminal is connected to the true line TX+, the gate of an NMOS transistor is applied with the positive data signal D+, and the gate of a PMOS transistor is applied with the negative data signal D−.

The fourth transmission gate 322 is configured such that one terminal is connected to the other terminal of the second data current source 200, the other terminal is connected to the bar line TX−, the gate of a PMOS transistor is applied with the positive data signal D+, and the gate of an NMOS transistor is applied with the negative data signal D−.

Accordingly, if data to be transmitted transits and the positive data signal D+ is in a logic high state, the third transmission gate 321 is turned on and the fourth transmission gate 322 is turned off, and the negative data current I2 supplied from the second data current source 200 is supplied to the true line TX+. If the positive data signal D+ is in a logic low state, the third transmission gate 321 is turned off and the fourth transmission gate 322 is turned on, and the negative data current I2 supplied from the second data current source 200 is supplied to the bar line TX−.

Through the switching operations of the first and second selection switches 310 and 320 configured in these ways, if the positive data current I1 is supplied to the bar line TX−, the negative data current I2 is supplied to the true line TX+ so that differential current is transmitted to a transmitter, and if the positive data current I1 is supplied to the true line TX+, the negative data current I2 is supplied to the bar line TX− so that differential current is transmitted to a transmitter.

The equalizing switch 400 is turned on for a predetermined time when transition newly occurs after data is transmitted, equalizes the potentials of the true line TX+ and the bar line TX−, and is then turned off so that the positive data current I1 and the negative data current I2 are supplied. The equalizing switch 400 includes a fifth transmission gate which has both terminals respectively connected to the true line TX+ and bar line TX− and the gates applied with an equalization control signal.

The switching controller is configured to generate the positive data signal D+ and the negative data signal D− depending upon the logic state of data to be transmitted from the transmitter and whether the data to be transmitted transits or not, and apply the generated signals to the first through fourth transmission gates 311, 312, 321 and 322 so that transmission lines to be supplied with the positive data current I1 and the negative data current I2 are selected. Also, the switching controller is configured to generate the equalization control signal depending upon whether the data to be transmitted transits or not, apply the generated signal to the fifth transmission gate, and equalize the potentials of the true line TX+ and the bar line TX− so that current values to be transmitted are stabilized.

Figure 3:
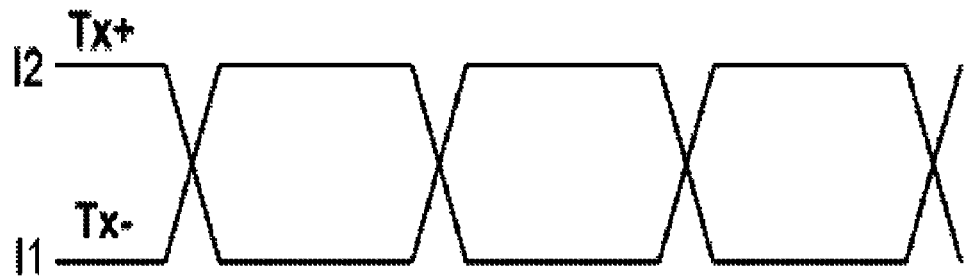
FIG. 3 is a view illustrating levels of differential current applied to a pair of transmission lines in a current driving scheme using independent current signals according to the present invention.

In the transmitter configured as mentioned above, the positive data current I1 from the first data current source 100 is supplied independently to the true line TX+ and the bar line TX− through the switching operation of the first selection switch 310, and the negative data current I2 from the second data current source 200 is supplied independently to the bar line TX− and the true line TX+ through the switching operation of the second selection switch 320. At this time, because the differential current transmitted to the receiver through the true line TX+ and the bar line TX− constituting the pair of transmission lines is not influenced by additional current applied from an outside and is independently determined by a difference between the positive data current I1 and the negative data current I2, the differential current can have a constant value without an offset as shown in FIG. 3.

That is to say, even though errors occur due to deviations in terms of designs of the current sources, processing conditions, test conditions, etc., since the differential current generated by the difference between the first data current source 100 and the second data current source 200 is determined to be always constant, it can be understood that the first data current source 100 designates one independent logic state by the level of the positive data current I1 and the second data current source 200 designates the other independent logic state by the level of the negative data current I2. Therefore, the data to be transmitted from the transmitter can be represented as a logic state by the difference between these independent positive data current I1 and negative data current I2.

Next, a current driving type receiver using independent current signals in accordance with another embodiment of the present invention will be described.

Figure 4:
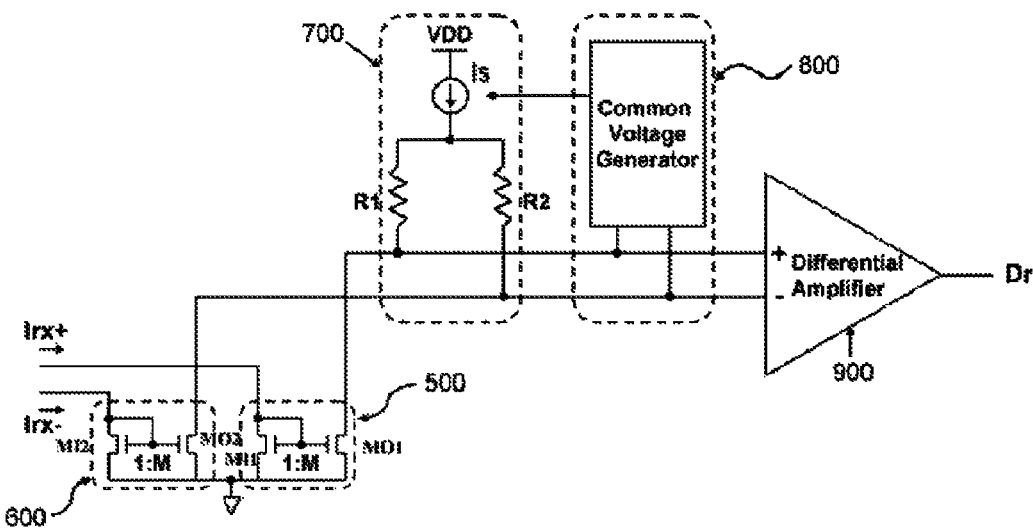
FIG. 4 is a circuit diagram illustrating a first exemplary current driving type receiver using independent current signals which has a single I-V converter, in accordance with another embodiment of the present invention.

Referring to FIG. 4 which shows a first exemplary receiver, a current driving type receiver using independent current signals in accordance with another embodiment of the present invention includes a true line current mirror 500 configured to receive current flowing through the true line TX+ of the pair of transmission lines, a bar line current mirror 600 configured to receive current flowing through the bar line TX− of the pair of transmission lines, a single I-V converter 700 configured to generate reception voltages corresponding to the current received from the true line current mirror 500 and the bar line current mirror 600, and a differential amplifier 900 configured to amplify the levels of the reception voltages.

The true line current mirror 500 receives the positive data current I1 or the negative data current I2 transmitted from the transmitter through the true line TX+, and generates true line reception current Irx+. The true line current mirror 500 includes a first input transistor MI1 in which one terminal and the gate are connected to the true line TX+ and the other terminal is connected to a ground terminal and a first output transistor MO1 in which the gate is connected to the gate of the first input transistor MI1, one terminal is connected to the ground terminal and the other terminal outputs mirrored true line reception current Irx+.

The bar line current mirror 600 receives the negative data current I2 or the positive data current I1 transmitted from the transmitter through the bar line TX−, and generates bar line reception current Irx−. The bar line current mirror 600 includes a second input transistor MI2 in which one terminal and the gate are connected to the bar line TX− and the other terminal is connected to the ground terminal and a second output transistor MO2 in which the gate is connected to the gate of the second input transistor MI2, one terminal is connected to the ground terminal and the other terminal outputs mirrored bar line reception current Irx−.

It is preferred that the true line current mirror 500 and the bar line current mirror 600 be configured such that, in order to accomplish optimum performance of the single I-V converter 700 which will be described later, the first and second output transistors MO1 and MO2 are formed to have channel widths a certain number of times (for example, n times) greater than the channel widths of the first and second input transistors MI1 and MI2, so that magnitudes of the current transmitted through the true line TX+ and the bar line TX− can be increased and mirroring can be implemented at a predetermined ratio.

The single I-V converter 700 includes a first resistor R1 which is connected at one end thereof to a node to which the true line reception current Irx+ is supplied, a second resistor R2 which is connected at one end thereof to a node to which the bar line reception current Irx− is supplied, a current source Is which is commonly connected to the other ends of the first resistor R1 and the second resistor R2, and a terminal of the power supply voltage VDD into and from which the true line reception current Irx+ and the bar line reception current Irx− simultaneously flow by the current source Is and which determines the levels of a true line reception voltage and a bar line reception voltage that correspond to the received current.

Hence, the single I-V converter 700 instantaneously converts a difference in the levels of current generated by the true line current mirror 500 and the bar line current mirror 600 into a voltage level so that an error between the true line TX+ and the bar line TX− can be lessened.

The receiver can further include a common voltage generator 800. The common voltage generator 800 is configured to make constant the levels of the true line reception voltage and the bar line reception voltage that are converted by the single I-V converter 700 after having passed through the true line current mirror 500 and the bar line current mirror 600 to be inputted to the differential amplifier 900, so that the differential amplifier 900 can operate stably. Thus, a stable operation point can be obtained in the receiver so that the performance of the differential amplifier 900 can be optimized. In the common voltage generator 800, a first terminal is connected to the current source Is, a second terminal is connected to a connection node of the true line current mirror 500 and the first resistor R1 so as to be connected to the non-inverting terminal of the differential amplifier 900, and a third terminal is connected to a connection node of the bar line current mirror 600 and the second resistor R2 so as to be connected to the inverting terminal of the differential amplifier 900.

In this way, since the common voltage generator 800 can generate common voltages of various values, design information of a differential amplifier employed in the conventional LVDS (low voltage differential signaling) or m-LVDS (mini low voltage differential signaling) as interface standards for high speed transmission of data can be used as it is.

The differential amplifier 900 is configured to receive the true line reception voltage and the bar line reception voltage generated in the single I-V converter 700 through the non-inverting terminal and the inverting terminal thereof, amplify a difference between both voltages to a predetermined level, and restore the data transmitted from the transmitter.

Figure 5:
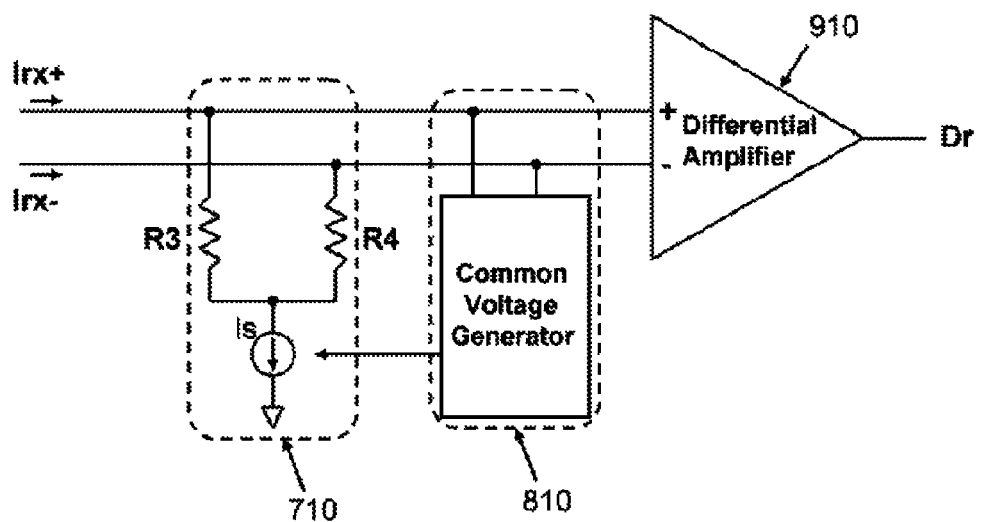
FIG. 5 is a circuit diagram illustrating a second exemplary current driving type receiver using independent current signals which has a single I-V converter, in accordance with another embodiment of the present invention.

Referring to FIG. 5 which shows a second exemplary receiver, a current driving type receiver using independent current signals in accordance with another embodiment of the present invention includes a single I-V converter 710 configured to receive current flowing through the true line TX+ of the pair of transmission lines and current flowing through the bar line TX− of the pair of transmission lines and instantaneously convert a difference in the levels of both current into a voltage level, a common voltage generator 810 configured to make constant the voltage level converted by the single I-V converter 710 so that the constant voltage level can enable a differential amplifier to operate stably, and a differential amplifier 910 configured to receive through the non-inverting terminal and the inverting terminal thereof the voltage levels converted in the single I-V converter 710 and generated as stable operation voltages, amplify the difference between both voltages, and restore data.

Hence, in the second example, without using separate current mirrors, true line reception current Irx+ and bar line reception current Irx− received from the pair of transmission lines are directly converted into voltage levels by the single I-V converter 710 and are supplied to the input terminals of the differential amplifier 910.

Accordingly, the single I-V converter 710 includes a third resistor R3 which is connected at one end thereof to the true line TX+ of the pair of transmission lines, a fourth resistor R4 which is connected at one end thereof to the bar line TX− of the pair of transmission lines, and a current source Is which has one end commonly connected to the other ends of the third resistor R3 and the fourth resistor R4 and the other end connected to the ground terminal. As the true line reception current Irx+ and the bar line reception current Irx− simultaneously flow into one ends of the third resistor R3 and the fourth resistor R4, current corresponding to the true line reception current Irx+ and the bar line reception current Irx− flows into and out of the current source Is, and a true line reception voltage and a bar line reception voltage having voltage levels corresponding to respective reception current are generated.

The common voltage generator 810 is configured to change the levels of the reception voltages that are converted based on the fine reception current directly received from the pair of transmission lines, into constant levels for enabling the receiver to operate stably. In the common voltage generator 810, a first terminal is connected to the current source Is, a second terminal forms a common node together with one end of the third resistor R3 and is connected to the non-inverting terminal of the differential amplifier 910, and a third terminal forms a common node together with one terminal of the fourth resistor R4 and is connected to the inverting terminal of the differential amplifier 910.

In the second exemplary receiver, since separate current mirrors configured to mirror received current at a predetermined ratio for the purpose of ensuring stable operation are not used, current consumption can be significantly reduced, and the stable operation of the receiver can be accomplished due to the fact that the levels of the reception voltages after the conversion of the received current are made constant by the common voltage generator 810.

Hereafter, an interface system for COG application, which adopts the current driving type transmitter and receiver using independent current signals, in accordance with another embodiment of the present invention will be described.

Figure 6:
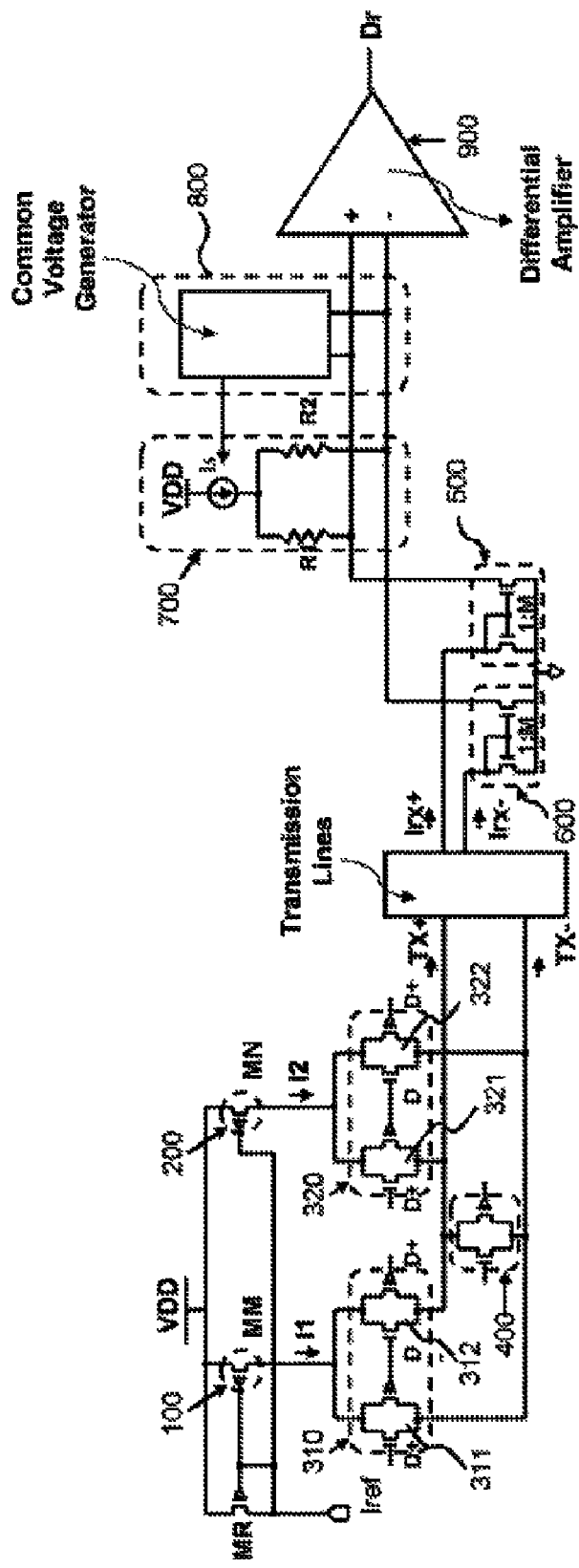
FIG. 6 is a view illustrating the configuration of a current driving type interface system which adopts the first exemplary receiver, in accordance with another embodiment of the present invention.

Referring to FIG. 6, an interface system for COG application, which adopts the current driving type transmitter and receiver using independent current signals, in accordance with another embodiment of the present invention includes a transmitter configured to selectively transmit positive data current and negative data current to a true line TX+ and a bar line TX− through switching operations and generate differential current indicating a logic state of data to be transmitted, transmission lines composed of the true line and the bar line and configured to transmit the positive data current and the negative data current from the transmitter, and a receiver configured to instantaneously convert a difference in the levels of true line reception current and bar line reception current received from the true line and the bar line into a voltage level and restore data.

In order to generate differential current indicating the logic state of the data to be transmitted, the transmitter includes a first data current source configured to supply positive data current I1 indicating one logic state, a second data current source configured to supply negative data current I2 indicating the other logic state, a selection switch configured to select, between the true line TX+ and the bar line TX−, a transmission line to be supplied with the positive data current or negative data current depending upon the value of the data to be transmitted, an equalizing switch configured to equalize the potentials of the pair of transmission lines, and a switching controller configured to control switching operations depending upon the value of the data to be transmitted.

The receiver can be configured such that the difference in levels of true line reception current Irx+ received through the true line TX+ and bar line reception current Irx− received through the bar line TX− is directly converted into a difference in voltage levels by a single I-V converter and the converted difference in voltage levels is inputted to and amplified by a differential amplifier.

To this end, referring to FIG. 6, the reliever can include a true line current mirror configured to receive current flowing through the true line TX+ and generate the true line reception current Irx+, a bar line current mirror configured to receive current flowing through the bar line TX− and generate the bar line reception current Irx−, a single I-V converter configured to directly convert the difference in the levels of the true line reception current Irx+ and the bar line reception current Irx− into a difference in voltage levels, a common voltage generator configured to make constant the levels of a true line reception voltage and a bar line reception voltage that are converted by the single I-V converter so that a differential amplifier can operate stably, and a differential amplifier configured to receive and amplify the difference in the levels of the reception voltages and restore data.

Figure 7:
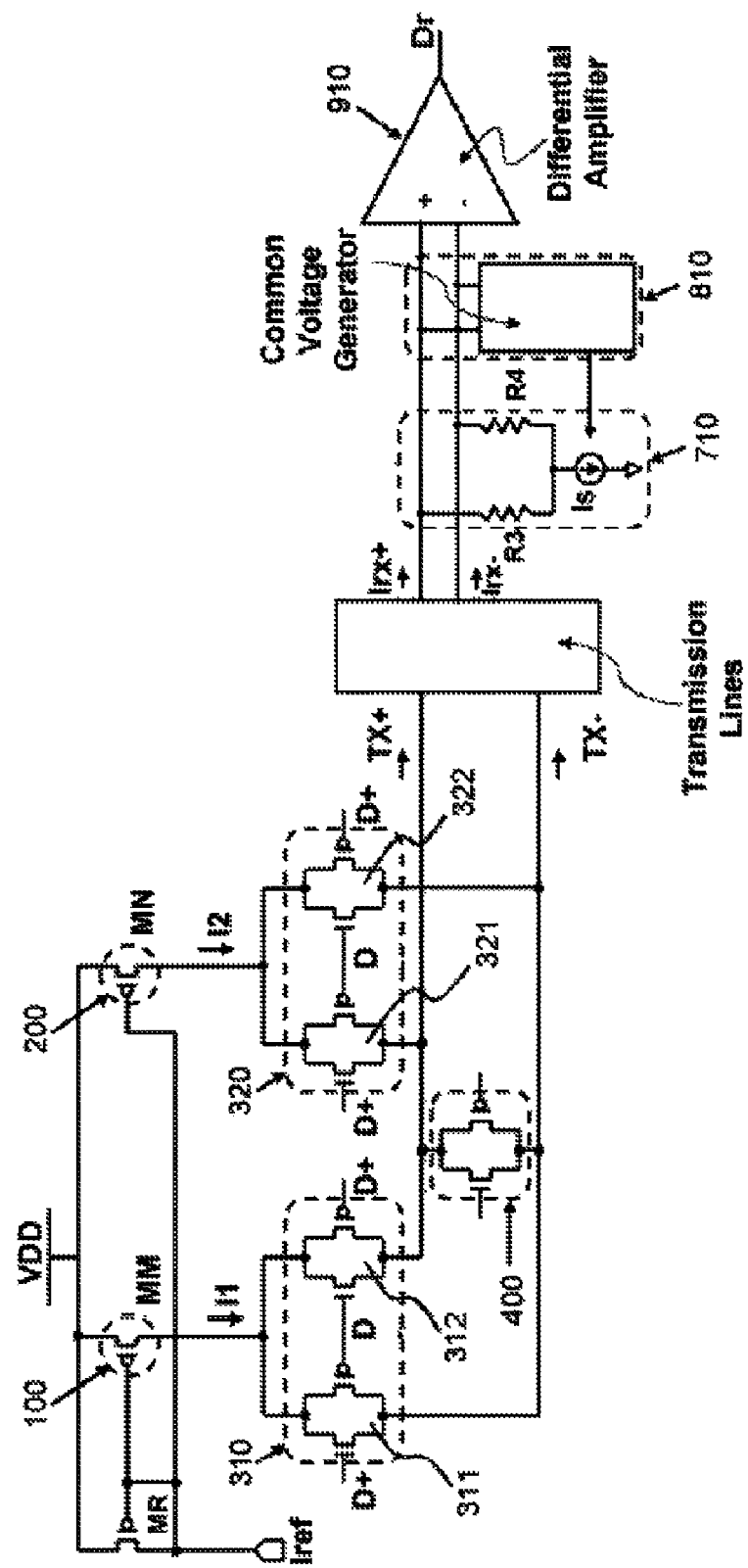
FIG. 7 is a view illustrating the configuration of a current driving type interface system which adopts the second exemplary receiver, in accordance with another embodiment of the present invention.

Also, referring to FIG. 7, alternatively, receiver can include a single I-V converter configured to receive current flowing through the true line TX+ and current flowing through the bar line TX− and instantaneously convert a difference in the levels of both current into a voltage level, a common voltage generator configured to make constant the voltage level converted by the single I-V converter so that the constant voltage level can enable a differential amplifier to operate stably, and a differential amplifier configured to receive the voltage levels converted in the single I-V converter and generated as stable operation voltages, amplify the difference between both voltages, and restore data.

Since the other configurations of the transmitter and the receiver are the same as those of the current driving type transmitter and receiver using independent current signals described in the first and second embodiments of the present invention, descriptions thereof will be omitted herein.

As is apparent from the above description, the present invention provides advantages in that a logic state of data to be transmitted is independently generated by a difference between positive data current and negative data current generated by reference current and is then transmitted, so that a difference in current applied to a pair of transmission lines can be kept constant, and a difference in levels of current received through the pair of transmission lines is simultaneously converted into a voltage level by a single I-V converter, so that errors in differential current transmitted to a true line and a bar line can be lessened.

Also, the present invention provides advantages in that layout areas of a transmitter and a receiver can be decreased.

In addition, due to the fact that various voltages levels are generated by generating a common voltage at the input terminal of a differential amplifier of the receiver, design information in a conventional low voltage differential signaling scheme or a conventional multi-point low voltage differential signaling scheme can be easily applied.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A current driving type transmitter using independent current signals, adapted for transmitting a logic state of data by differential current supplied through a pair of transmission lines composed of a true line and a bar line, comprising:
   a first data current source configured to independently generate and supply positive data current that constitutes the differential current;
   a second data current source configured to independently generate and supply negative data current that constitutes the differential current;
   a first selection switch configured to supply the positive data current generated by the first data current source to the true line or the bar line through a switching operation depending upon a logic state of data to be transmitted;
   a second selection switch configured to supply the negative data current generated by the second data current source to the bar line or the true line through a switching operation depending upon a logic state of data to be transmitted;
   an equalizing switch connected between the true line and the bar line and configured to equalize potentials through a switching operation; and
   a switching controller configured to control the switching operations of the first selection switch, the second selection switch and the equalizing switch depending upon whether the data to be transmitted transits or not.

2. The current driving type transmitter according to claim 1,
   wherein the first data current source comprises a second MOS transistor which is connected to a first MOS transistor for supplying reference current, serves as a current mirror for independently generating the positive data current, and is configured such that one terminal is connected to a power supply voltage, the other terminal is connected to the first selection switch, and a gate is connected to a gate of the first MOS transistor; and
   wherein the second data current source comprises a third MOS transistor which is connected to the first MOS transistor, serves as a current mirror for independently generating the negative data current, and is configured such that one terminal is connected to the power supply voltage, the other terminal is connected to the second selection switch, and a gate is connected to the gate of the first MOS transistor.

3. The current driving type transmitter according to claim 1,
   wherein the first selection switch comprises first and second transmission gates which are configured such that one terminals are commonly connected to the first data current source, gates are applied with a positive data signal and a negative data signal and the other terminals are respectively connected to the bar line and the true line, and select a transmission line to be supplied with the positive data current through, a switching operation; and
   wherein the second selection switch comprises third and fourth transmission gates which are configured such that one terminals are commonly connected to the second data current source, gates are applied with the positive data signal and the negative data signal and the other terminals are respectively connected to the true line and the bar line, and select a transmission line to be supplied with the negative data current through a switching operation.

4. The current driving type transmitter according to claim 3,
   wherein the first transmission gate is configured such that one terminal is connected to the first data current source, the other terminal is connected to the bar line, a gate of an NMOS transistor is applied with the positive data signal, and a gate of a PMOS transistor is applied with the negative data signal;
   wherein the second transmission gate is configured such that one terminal is connected to the first data current source, the other terminal is connected to the true line, a gate of a PMOS transistor is applied with the positive data signal, and a gate of an NMOS transistor is applied with the negative data signal;
   wherein the third transmission gate is configured such that one terminal is connected to the second data current source, the other terminal is connected to the true line, a gate of an NMOS transistor is applied with the positive data signal, and a gate of a PMOS transistor is applied with the negative data signal; and
   wherein the fourth transmission gate is configured such that one terminal is connected to the second data current source, the other terminal is connected to the bar line, a gate of a PMOS transistor is applied with the positive data signal, and a gate of an NMOS transistor is applied with the negative data signal.

5. A current driving type receiver adapted for receiving differential current through a pair of transmission lines composed of a true line and a bar line and restoring a logic state of data, comprising:
　a true line current mirror configured to receive current flowing through the true line and generate true line reception current;
　a bar line current mirror configured to receive current flowing through the bar line and generate bar line reception current;
　a single I-V converter configured to instantaneously convert a difference in levels of the true line reception current and the bar line reception current into a voltage level corresponding thereto; and
　a differential amplifier configured to amplify a converted reception voltage,
　wherein the single I-V converter includes a first resistor which is connected at one end thereof to a node to which the true line reception current is supplied, a second resistor which is connected at one end thereof to a node to which the bar line reception current is supplied, a current source which is commonly connected to the other ends of the first resistor and the second resistor, and a terminal of a power supply voltage into and from which the true line reception current and the bar line reception current flow by the current source and which determines levels of reception voltages,
　wherein the single I-V converter further includes a common voltage generator which is configured such that a first terminal is connected to the current source, a second terminal is connected to a connection node of the true line current mirror and the first resistor so as to be connected to a non-inverting terminal of the differential amplifier, and a third terminal is connected to a connection node of the bar line current mirror and the second resistor so as to be connected to an inverting terminal of the differential amplifier.

6. A current driving type receiver adapted for receiving differential current through a pair of transmission lines composed of a true line and a bar line and restoring a logic state of data, comprising:
　a single I-V converter including a third resistor which is connected at one end thereof to the true line and receives true line reception current, a fourth resistor which is connected at one end thereof to the bar line and receives bar line reception current, and a current source which has one end commonly connected to the other ends of the third resistor and the fourth resistor and the other end connected to a ground terminal; and
　a differential amplifier configured to receive through a non-inverting terminal and an inverting terminal thereof a difference in voltage levels converted in the single I-V converter and amplify the difference.

7. The current driving type receiver according to claim 6, wherein the single I-V converter further includes a common voltage generator which is configured such that a first terminal is connected to the current source, a second terminal forms a common node together with one end of the third resistor and is connected to the non-inverting terminal of the differential amplifier, and a third terminal forms a common node together with one terminal of the fourth resistor and is connected to the inverting terminal of the differential amplifier.

8. A differential current driving type interface system, adapted for transmitting a logic state of data using different current, receiving the differential current, and restoring the logic state of the data, comprising:
　a transmitter including a first data current source configured to independently generate and supply positive data current that constitutes the differential current, a second data current source configured to independently generate and supply negative data current, a first selection switch configured to supply the positive data current to a true line or a bar line through a switching operation depending upon a logic state of data to be transmitted, a second selection switch configured to supply the negative data current to the bar line or the true line through a switching operation, an equalizing switch connected between the true line and the bar line and configured to equalize potentials of transmission lines, and a switching controller configured to control the switching operations;
　the transmission lines composed of the true line and the bar line which are supplied with the positive data current and the negative data current through the switching operations of the first and second selection switches; and
　a receiver configured to instantaneously convert a difference in levels of true line reception current received from the true line and bar line reception current received from the bar line into a voltage level, and restore data.

9. The differential current driving type interface system according to claim 8,
　wherein the first data current source comprises a second MOS transistor which is connected to a first MOS transistor for supplying reference current, serves as a current mirror for independently generating the positive data current, and is configured such that one terminal is connected to a power supply voltage, the other terminal is connected to the first selection switch, and a gate is connected to a gate of the first MOS transistor; and
　wherein the second data current source comprises a third MOS transistor which is connected to the first MOS transistor, serves as a current mirror for independently generating the negative data current, and is configured such that one terminal is connected to the power supply voltage, the other terminal is connected to the second selection switch, and a gate is connected to the gate of the first MOS transistor.

10. The differential current driving type interface system according to claim 8,
　wherein the first selection switch comprises first and second transmission gates which are configured such that one terminals are commonly connected to the first data current source, gates are applied with a positive data signal and a negative data signal and the other terminals are respectively connected to the bar line and the true line, and select a transmission line to be supplied with the positive data current through a switching operation; and
　wherein the second selection switch comprises third and fourth transmission gates which are configured such that one terminals are commonly connected to the second data current source, gates are applied with the positive data signal and the negative data signal and the other terminals are respectively connected to the true line and the bar line, and select a transmission line to be supplied with the negative data current through a switching operation.

11. The differential current driving type interface system according to claim 8, wherein the receiver comprises:
   a true line current mirror configured to receive current flowing through the true line and generate the true line reception current;
   a bar line current mirror configured to receive current flowing through the bar line and generate the bar line reception current;
   a single I-V converter including a first resistor which is connected at one end thereof to a node to which the true line reception current is supplied, a second resistor which is connected at one end thereof to a node to which the bar line reception current is supplied, a current source which is commonly. connected to the other ends of the first resistor and the second resistor, and a terminal of a power supply voltage into and from which the true line reception current and the bar line reception current flow by the current source and which determines levels of reception voltages; and
   a differential amplifier configured to receive and amplify a difference in the levels of the reception voltages.

12. The differential current driving type interface system according to claim 11, wherein the single I-V converter further includes a common voltage generator which is configured such that a first terminal is connected to the current source, a second terminal is connected to a connection node of the true line current mirror and the first resistor so as to be connected to a
   non-inverting terminal, of the differential amplifier, and a third terminal is connected to a connection node of the bar line current mirror and the second resistor so as to be connected to an inverting terminal of the differential amplifier.

13. The differential current driving type interface system according to claim 8, wherein the receiver comprises:
   a single I-V converter including a third resistor which is connected at one end thereof to the true line and receives true line reception current, a fourth resistor which is connected at one end thereof to the bar line and receives bar line reception current, and a current source which has one end commonly connected to the other ends of the third resistor and the fourth resistor and the other end connected to a ground terminal; and
   a differential amplifier configured to receive through a non-inverting terminal and an inverting terminal thereof a difference in voltage levels converted in the single I-V converter and amplify the difference.

14. The differential current driving type interface system according to claim 13, wherein the single I-V converter further includes a common voltage generator which is configured such that a first terminal is connected to the current source, a second terminal forms a common node together with one end of the third resistor and is connected to the non-inverting terminal of the differential amplifier, and a third terminal forms a common node together with one terminal of the fourth resistor and is connected to the inverting terminal of the differential amplifier.

* * * * *